(12) United States Patent
Mei et al.

(10) Patent No.: US 12,031,071 B2
(45) Date of Patent: Jul. 9, 2024

(54) QUANTUM DOT FILM, QUANTUM DOT DEVICE, AND DISPLAY PANEL

(71) Applicant: BOE TECHNOLOGY GROUP CO., LTD., Beijing (CN)

(72) Inventors: Wenhai Mei, Beijing (CN); Yichi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 478 days.

(21) Appl. No.: 17/246,833

(22) Filed: May 3, 2021

(65) Prior Publication Data

US 2022/0073816 A1    Mar. 10, 2022

(30) Foreign Application Priority Data

Sep. 4, 2020    (CN) .......................... 202010922320.8

(51) Int. Cl.
| | |
|---|---|
| *C09K 11/56* | (2006.01) |
| *G02B 1/04* | (2006.01) |
| *G02B 5/20* | (2006.01) |
| *B82Y 20/00* | (2011.01) |
| *B82Y 30/00* | (2011.01) |
| *B82Y 40/00* | (2011.01) |
| *G03F 7/039* | (2006.01) |
| *H10K 50/115* | (2023.01) |

(Continued)

(52) U.S. Cl.
CPC .............. *C09K 11/565* (2013.01); *G02B 1/04* (2013.01); *G02B 5/20* (2013.01); *B82Y 20/00* (2013.01); *B82Y 30/00* (2013.01); *B82Y 40/00* (2013.01); *G03F 7/0392* (2013.01); *H10K 50/115* (2023.02); *H10K 50/15* (2023.02); *H10K 50/16* (2023.02)

(58) Field of Classification Search
CPC .......... C09K 11/565; G02B 1/04; G02B 5/20; H01L 51/502
See application file for complete search history.

(56) References Cited

U.S. PATENT DOCUMENTS

| | | | |
|---|---|---|---|
| 2015/0255690 | A1 | 9/2015 | Vo et al. |
| 2020/0332181 | A1 | 10/2020 | Zhang |

FOREIGN PATENT DOCUMENTS

| | | |
|---|---|---|
| CN | 109266350 A | 1/2019 |
| CN | 109728203 A | 5/2019 |

(Continued)

OTHER PUBLICATIONS

Heath and Stuart L.Cooper, A—Polyurethanes, Biomaterials Science (Third Edition), an Introduction to Materials in Medicine, 2013, pp. 79-82. (Year: 2013).*

(Continued)

*Primary Examiner* — Bijan Ahvazi
(74) *Attorney, Agent, or Firm* — HOUTTEMAN LAW LLC

(57) ABSTRACT

The present disclosure provides a quantum dot film, a quantum dot device, and a display panel. The provided quantum dot film comprises a plurality of quantum dots and a plurality of polymer molecular chains. The polymer molecule chain comprises at least one first segment and at least one second segment, wherein the first segment has a tensile modulus greater than that of the second segment, and the second segment has a flexural modulus less than that of the first segment.

15 Claims, 10 Drawing Sheets

(51) Int. Cl.
*H10K 50/15* (2023.01)
*H10K 50/16* (2023.01)

(56) References Cited

FOREIGN PATENT DOCUMENTS

| CN | 110330517 A | | 10/2019 | |
|---|---|---|---|---|
| CN | 111410748 A | * | 7/2020 | ........... C08G 83/008 |
| CN | 111410748 A | | 7/2020 | |
| WO | WO-2021007467 A1 | * | 1/2021 | ............. C08G 18/10 |

OTHER PUBLICATIONS

Yang al. (High-resolution patterning of colloidal quantum dots via non-destructive, light-driven ligand crosslinking; Nature Communications, (2020), 11, 2874, 1-9. (Year: 2020).*

China Patent Office, First Office Action dated Jul. 25, 2022, for corresponding Chinese application 202010922320.8.

* cited by examiner

QUANTUM DOT FILM, QUANTUM DOT DEVICE, AND DISPLAY PANEL

TECHNICAL FIELD

The present disclosure belongs to a technical field of photoelectric devices, and is particularly directed to a quantum dot film, a quantum dot device and a display panel that can be used in photoelectric devices.

BACKGROUND ART

With development of quantum dot technology, quantum dot technology is generally applied to quantum dot films, and the quantum dot films are applied to various display panels, such as flexible display panels. The flexible display panel is subjected to a bending-restoring deformation process for many times during use. However, the quantum dot film has poor bending characteristic since the quantum dots in the quantum dot film are inorganic nanoparticles. Therefore, the quantum dot film is prone to crack and is difficult to restore flatness after the flexible display panel is bent repeatedly, resulting in a significant decrease in a service life of the quantum dot film.

SUMMARY

The present disclosure is intended to solve at least one of the technical problems existing in the prior art, and provides a quantum dot film with improved mechanical stability to avoid cracks or unrecoverable deformation after being bent for many times, and thus increase the service life.

In one aspect, the present disclosure provides a quantum dot film comprising a plurality of quantum dots and a plurality of polymer molecular chains;

the polymer molecular chain comprises at least one first segment and at least one second segment; wherein, the first segment has a tensile modulus greater than that of the second segment, and the second segment has a flexural modulus less than that of the first segment.

Optionally, the first segment has a tensile modulus greater than 10 GPa, and the second segment has a tensile modulus greater than 5 GPa; and the first segment has a flexural modulus less than 4 GPa, and the second segment has a flexural modulus less than 2 GPa.

Optionally, the first segment is derived from an aromatic compound monomer having at least one polar group.

Optionally, the polar group may be selected from at least one of alkyl, carboxyl, aldehyde group, carbonyl, amine group, epoxy group, hydroxyl, alkenyl, and alkynyl.

The aromatic compound may selected from a compound with monocyclic aromatic structure, a compound with polycyclic aromatic structure, and a compound with fused ring aromatic structure, wherein the monocyclic aromatic structure, the polycyclic aromatic structure, and the fused ring aromatic structure are substituted or unsubstituted. In the case of substitution, at least one hydrogen in the aromatic ring is substituted by at least one selected from the group consisting of alkyl, alkylthio, halogen atom, hydroxyl, amino, alkenyl, alkynyl, aryl, ester group, mercapto, cyano, and nitryl.

The monocyclic aromatic structure, the polycyclic aromatic structure, and the fused ring aromatic structure are selected from at least one of phenyl, biphenyl, naphthyl, acenaphthylene group, acenaphthenyl, fluorenyl, phenanthryl, anthryl, fluoranthryl, pyrenyl, benzo(a)anthryl, benzo(a)pyrenyl, indene(1, 2, 3-cd)pyrenyl and dibenzo(a, n)yl.

Optionally, the second segment comprises polyester, polyether, or polyether ester.

Optionally, the second segment further comprises a polyamide linkage.

Optionally, the polyester is at least one of polybutylene glycol adipate and polycaprolactone diol.

The polyether is at least one of polytetramethylene ether glycol and polyethylene glycol.

Optionally, the first segment is formed from polymerization of at least one of toluene diisocyanate and naphthalene diisocyanate, and the second segment is derived from at least one of polybutylene glycol adipate, polytetramethylene ether glycol, and polyethylene glycol.

Optionally, the first segment is formed from a compound with a fused ring aromatic structure; and each quantum dot is connected with a ligand; wherein the ligand comprises a body portion comprising a benzene ring structure or a fused ring aromatic structure.

Optionally, the ligand further comprises a long-chain portion and a short-chain portion, the body portion is connected between the long-chain portion and the short-chain portion, and the short-chain portion is connected to the corresponding quantum dot; wherein the long-chain portion is an alkane chain; and the short chain portion comprises a carbon chain, and a coordinating group at a terminal of the carbon chain. The coordinating group is connected to the quantum dot.

Optionally, the plurality of polymer molecular chains are distributed among the plurality of quantum dots.

Alternatively, the polymer molecular chain is a ligand of the quantum dot, with coordinating chains connected to the polymer, and the quantum dots is connected one by one to the polymer chains through the coordinating chains.

In another aspect, the present disclosure further provides a quantum dot device comprising the quantum dot film described above.

Optionally, the quantum dot device is a quantum dot light emitting diode comprising, in sequence, a first electrode, a light emitting layer, and a second electrode, the light emitting layer being arranged between the first electrode and the second electrode; wherein the light emitting layer comprises the quantum dot film.

Optionally, the quantum dot light emitting diode further comprises a hole injection layer and a hole transport layer arranged in sequence on the first electrode, and an electron transport layer between the light emitting layer and the second electrode, wherein the light emitting layer is arranged on the hole transport layer.

Optionally, the quantum dot device is a quantum dot color filter comprising a plurality of optical filter regions, each optical filter region is provided with an optical filter, and the optical filter comprises the quantum dot film.

Optionally, the optical filter comprises a red optical filter, a green optical filter and a blue optical filter, the quantum dot color filter further comprises a substrate and a light shielding structure arranged between the optical filters corresponding to each of the colors. The optical filters and the light shielding structure are arranged on the substrate.

In yet another aspect, the present disclosure further provides a display panel comprising the quantum dot device described above.

Optionally, the quantum dot device is a quantum dot light emitting diode, the display panel further comprises red, green, and blue subpixels, and each of the red, green, and blue subpixels comprises a quantum dot light emitting diode corresponding to the color of the subpixel, and a thin film transistor (TFT) arranged on a side of the quantum dot light emitting diode away from the light exit side. The TFT is connected to the quantum dot light emitting diode such that the quantum dot light emitting diode is driven to emit light.

Optionally, the quantum dot device is a quantum dot color filter, wherein the display panel comprises the quantum dot color filter substrate and a display substrate, and the display substrate and the quantum dot color filter are arranged opposite to each other.

For the quantum dot film provided in the present disclosure, owing to the polymer added to the quantum dot film that has both of the first segment with high tensile modulus and the second segment with low flexural modulus, the second segment enables the quantum dot film to have good bending performance, which makes the quantum dot film to be bent easily; and the first segment can enable the quantum dot film not to expand and decompose under the influence of illumination and electric current, and can avoid cracks of the quantum dot film during being bent and stretched, thereby improving the mechanical stability of the quantum dot film, and avoiding cracks or unrecoverable deformation of the quantum dot film after being bent for many times, and thus increasing a service life of the quantum dot film.

DETAILED DESCRIPTIONS

Figure 1:
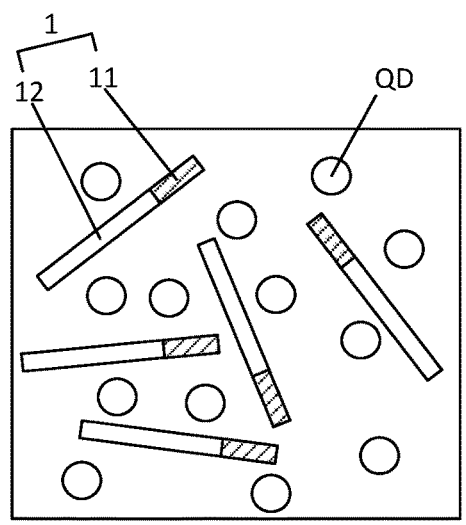
FIG. 1 is a schematic plan view of an exemplary quantum dot film provided in the present disclosure.

In order to make a skilled person in the art better understand technical solutions of the present disclosure, the following detailed description is provided with reference to the accompanying drawings and specific embodiments.

The shapes and sizes of the components in the drawings are not to scale, but are merely intended to facilitate the understanding to the embodiments of the present disclosure.

Technical or scientific terms used herein have the ordinary meaning as understood by a skilled person in the related art, unless defined otherwise. The terms "first", "second" and the like used herein are not intended to indicate any order, quantity, or importance, but rather are used to distinguish one element from another. Similarly, the terms "a", "an", "the" and the like used herein do not indicate a limitation of quantity, but rather indicate the presence of at least one. The terms "including", "comprising" and the like mean that the element or object preceding the term contains the element or object and its equivalent listed after the term, but does not exclude other elements or objects. The terms "connected" or "coupled" and the like are not restricted to physical or mechanical connections, but may include electrical connections, whether direct or indirect. The terms "upper", "lower", "left", "right", and the like are used only to indicate relative positional relationships, and these relative positional relationships may be changed as the absolute position of the object described is changed.

The present disclosure is described in detail below with reference to the accompanying drawings, but the present disclosure is not limited to these drawings.

In a first aspect, the present disclosure provides a quantum dot film. As shown in FIG. 1, the quantum dot film 100 comprises a plurality of quantum dots (QD) and a plurality of polymer molecular chains 1. The polymer molecular chains 1 comprise at least one first segment 11 and at least one second segment 12. The first segment 11 and the second segment 12 are connected to form the whole polymer molecular chain 1. The first segment 11 has a tensile modulus (i.e., Young's modulus) greater than that of the second segment 12, and the second segment 12 has a flexural modulus less than that of the first segment 11. In particular, the first segment 11 may have a tensile modulus greater than 10 GPa (i.e., $10 \times 10^9$ Pascal) and the second segment may have a tensile modulus greater than 5 GPa. The second segment 12 may have a flexural modulus less than 2 GPa (i.e., $2 \times 10^9$ Pascal) and the first segment may have a flexural modulus less than 4 GPa. Since the first segment 11 of polymer molecular chain 1 has a greater tensile modulus, it can be considered that the first segment can provide the quantum dot film 100 with hardness, thereby enabling the quantum dot film 100 not to decompose and expand under influence of illumination and electric current, and avoiding cracks of the quantum dot film 100 during being bent and stretched; and since the second segment 12 of polymer molecular chain 1 has a lower flexural modulus, it can be considered that the second segment 12 can provide the quantum dot film 100 with softness, that is, rendering the quantum dot film 100 easy to bend, thereby improving the bending performance of the quantum dot film 100. Therefore, the polymer molecular chain 1, formed by connecting the first segment 11 to the second segment 12, may improve the mechanical stability of the quantum dot film 100, and enable the deformation to recover while the quantum dot film 100 being easily bent, thereby avoiding cracks or unrecoverable deformation of the quantum dot film 100 after being bent for many times, and thus increasing service life of the quantum dot film.

Alternatively, the first segment 11 is formed from various types of chemicals or compounds.

For example, the first segment 11 may be formed from a compound having at least one polar group, and the first segment 11 may comprise at least one polar group. The polar groups are the groups with non-coincident positive and negative charge centers. The polar groups can provide the polymer having strong interactions between molecular chains (namely, between different first segments 11). Because the different first segments 11 of polymer molecular chains 1 have polar groups, there are great interactions between the different first segments 11. Therefore, the first segments 11 hardly move under external stress, ensuring the quantum dot film 100 not to decompose and expand under the influence of illumination and electric current. In addition, since the first segments 11 hardly move under external stress, the movement of the second segments 12 is hindered to a certain extent, thus providing conditions for the bending and recovery of the second segments 12. As such, the quantum dot film 100 has good performance of bending-recovery deformation.

Figure 2:
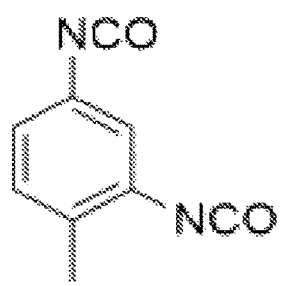
FIG. 2 is a molecular structure of an exemplary precursor compound (toluene diisocyanate) for forming the first segment of the polymer in the quantum dot film provided in the present disclosure.
Figure 3:
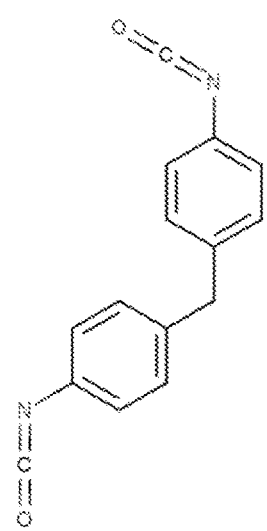
FIG. 3 is a molecular structure of another exemplary precursor compound (diphenylmethane diisocyanate) for forming the first segment of the polymer in the quantum dot film provided in the present disclosure.

Further, the first segment is derived from an aromatic compound monomer having at least one polar group. The polar group may be selected from at least one of alkyl, carboxyl, aldehyde group, carbonyl, amine group, epoxy group, hydroxyl, alkenyl, and alkynyl. The aromatic compound may be selected from a compound with monocyclic aromatic structure, a compound with polycyclic aromatic structure, and a compound with fused ring aromatic structure, wherein the monocyclic aromatic structure, the polycyclic aromatic structure, and the fused ring aromatic structure are substituted or unsubstituted. In the case of substitution, at least one hydrogen in the aromatic ring is substituted by at least one selected from the group consisting of alkyl, alkylthio, halogen atom, hydroxyl, amino, alkenyl, alkynyl, aryl, ester group, mercapto, cyano, and nitryl. Examples of various compounds for forming the first segment are shown in FIGS. 2 and 3. As shown in FIG. 2, the first segment 11 may be formed from an aromatic diisocyanate, that is, a diisocyanate unit having a benzene ring in the molecular structure. For example, the first segment 11 may be formed from toluene diisocyanate (TDI) or diphenylmethane diisocyanate (MDI), and the like. The molecular structure of TDI is shown in FIG. 2 with a molecular chemical formula of $C_9H_6N_2O_2$. The molecular structure of MDI is shown in FIG. 3 with a molecular chemical formula of $C_{15}H_{10}N_2O_2$. Alternatively, the first segment 11 may be formed from other chemicals having polar groups, which is not limited herein.

The first segment 11 may be formed from a monomer compound comprising a fused ring aromatic structure, thereby forming the first segment 11 with fused ring aromatic structure. The first segment 11 with the fused ring aromatic structure meets the requirement for high tensile modulus. Meanwhile, when the quantum dot film 100 is applied to the quantum dot light emitting diode, the fused ring aromatic structures on different first segments 11 of polymers 1 may attract with each other to form π-π interaction in the quantum dot film 100, due to the fused ring aromatic structure having a large electron cloud overlapping area, leading to the formation of carrier transport channels assembled by stacking of the first segments 11, thereby guiding the carrier transport and improving the performance of the quantum dot light emitting diode.

Figure 4:
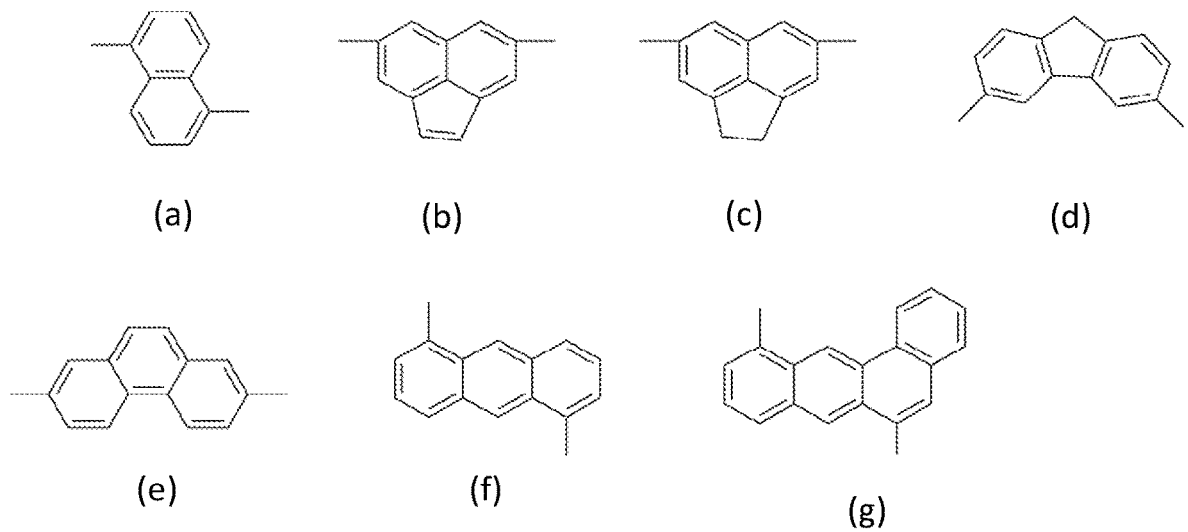
FIG. 4 is the molecular structure of various exemplary precursor compounds containing fused ring aromatic structure for forming the first segment of the polymer in the quantum dot film provided in the present disclosure.
Figure 5:
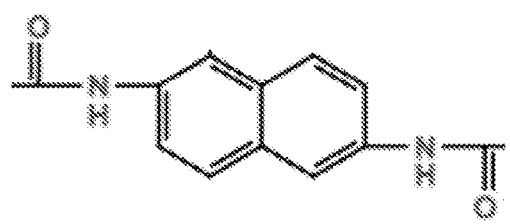
FIG. 5 shows a structure unit containing fused ring aromatic structure (naphthalene diisocyanate structure unit) for the first segment of the polymer in the quantum dot film provided in the present disclosure.

Further, as shown in FIG. 4, the fused ring aromatic structure may comprise any one of naphthalene shown in FIG. 4(a), acenaphthylene shown in FIG. 4(b), acenaphthene shown in FIG. 4(c), fluorene shown in FIG. 4(d), phenanthrene shown in FIG. 4(e), anthracene shown in FIG. 4(f), benzo(a)anthracene shown in FIG. 4(g), fluoranthene, pyrene, benzo(a)pyrene, indene(1, 2, 3-cd)pyrene, dibenzo (a, n). That is, the molecular structure of the first segment 11 comprises the structure of any one of the above chemicals, and at least one branched chain is connected to the structure of any one of the above chemicals. Take naphthalene diisocyanate as an example, the molecular structure of naphthalene diisocyanate is shown in FIG. 5 with a molecular chemical formula of $C_{12}H_6N_2O_2$. The molecular structure of naphthalene diisocyanate comprises naphthalene (shown in FIG. 4(a)).

It should be noted that the first segment 11 may comprise a plurality of polar groups and fused ring aromatic structures. Alternatively, the first segment 11 may comprise any one of the polar groups and the fused ring aromatic structures, which is not limited herein. Specifically, if the first segment 11 comprises the polar group and the fused ring aromatic structure, the structure of the first segment 11 comprises the fused ring aromatic structure, and at least one branched chain connected to the fused ring aromatic structure, wherein the branched chain connected to the fused ring aromatic structure may contain the polar group.

Alternatively, the second segment 12 is formed from various types of chemicals. For example, the second segment 12 may comprise polyester, and alternatively, the second segment 12 may comprise polyether. The molecular structures of the polyester or polyether may have multiple repeating units, and the polyester and polyether have the property of low flexural modulus. If the polyester or polyether is contained in polymer 1, it may enable the quantum dot film 100 to be bent easily, and improve the mechanical stability of the quantum dot film 100 during multiple bending-recovery deformations, avoiding cracks of the quantum dot film 100 after being bent for many times. Otherwise, oxygen and water vapor may enter the quantum dot film 100 from the cracks, reducing the performance of the quantum dots (QD).

Figure 6:
FIG. 6 shows a molecular structure of polybutylene glycol adipate for forming the second segment of the polymer in the quantum dot film provided in the present disclosure.
Figure 7:
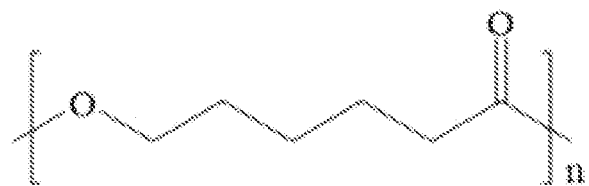
FIG. 7 shows a molecular structure of polycaprolactone diol for forming the second segment of the polymer in the quantum dot film provided in the present disclosure.
Figure 8:
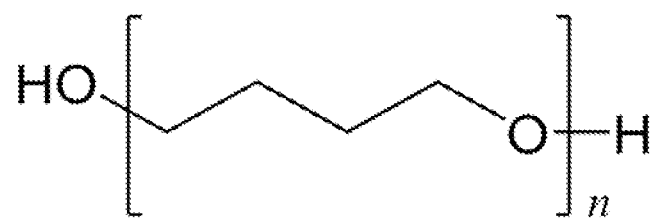
FIG. 8 shows a molecular structure diagram of polytetramethylene ether glycol for forming the second segment of the polymer in the quantum dot film provided in the present disclosure.

Further, the second segment 12 may comprise polyester. For example, the second segment 12 may be formed from polybutylene glycol adipate, the molecular structure of which is shown in FIG. 6 with 6 repeating units of $C_{11}H_{17}O_4$. For another example, the second segment 12 may be formed from polycaprolactone diol, the molecular structure of which is shown in FIG. 7 with n repeating units of $C_6H_{10}O_2$. If the second segment 12 comprises a polyether, the second segment 12 may be formed from polytetramethylene ether glycol. The molecular structure of polytetramethylene ether glycol is shown in FIG. 8, with a chemical formula of $H—(C_4H_8O)_n—OH$. Alternatively, the second segment 12 may comprise other polyester or polyether chemicals, which is not limited herein.

Figure 9:
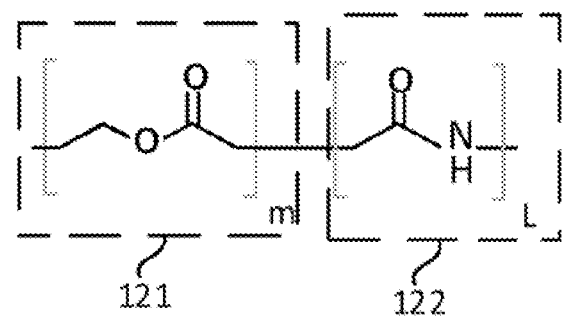
FIG. 9 shows a molecular structure of the exemplary second segment (containing polyester and polyamide linkage) of the polymer in the quantum dot film provided in the present disclosure.
Figure 10:
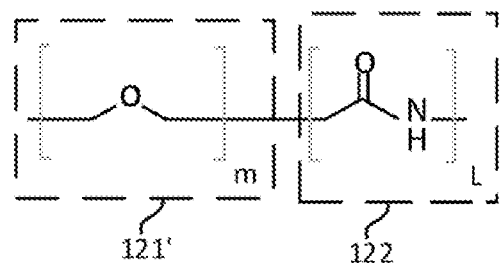
FIG. 10 shows a molecular structure of another exemplary second segment (containing polyether and polyamide linkage) of the polymer in the quantum dot film provided in the present disclosure.

Further, the second segment 12 may comprise polyester, polyether or polyether ester. The second segment 12 may further comprise a polyamide linkage, i.e., —[NHCO]— linkage. Referring to FIG. 9, the second segment 12 comprises at least the polyether 121 having m units of ester and the polyamide linkage 122 having L units of amide, wherein m>1 and L>1. The polyester 121 is connected to the polyamide linkage 122. Referring to FIG. 10, the second segment 12 comprises at least the polyether 121' having m units of ether and the polyamide linkage 122 having L units of amide, where m>1 and L>1. The polyether 121' is connected to the polyamide linkage 122. When the polyamide linkage 122 is contained in the second segment 12 of polymer 1, the hydrogen-bond interaction is formed between the polyamide linkages 122 in different second segments 12. Therefore, when the quantum dot film 100 is applied to the quantum dot light emitting diode, the second segments 12 may attract with each other to form transport channels assembled by stacking of the second segments 12, due to the hydrogen-bond interaction between the polyamide linkages 122 in different second segments 12 of polymer 1 in the quantum dot film 100.

As described above, the first segment 11 may comprise a fused ring aromatic structure. In this case, the quantum dot (QD) may be linked with a ligand, wherein the ligand comprises a body portion R1 comprising a benzene ring structure or a fused ring aromatic structure, for example, including any structure of naphthalene shown in FIG. 4(a), acenaphthylene shown in FIG. 4(b), acenaphthene shown in FIG. 4(c), fluorene shown in FIG. 4(d), phenanthrene shown in FIG. 4(e), anthracene shown in FIG. 4(f), benzo(a)anthracene shown in FIG. 4(g), fluoranthene, pyrene, benzo(a)pyrene, indene(1, 2, 3-cd)pyrene, dibenzo(a, n). The electron cloud of the body portion R1 of the ligand in the quantum dot (QD) may form π-π interaction with the electron cloud of the fused ring aromatic structure in the first segment 11 of polymer 1 due to the benzene ring structure and the fused ring aromatic structure both having large electron cloud overlapping areas, and therefore, the quantum dots (QD) may accumulate in the carrier transport channels formed by stacking of the first segments 11.

The quantum dot film may be contained in or be applied to various quantum dot devices, such as a quantum dot light emitting diode or a quantum dot color filter.

Figure 11:
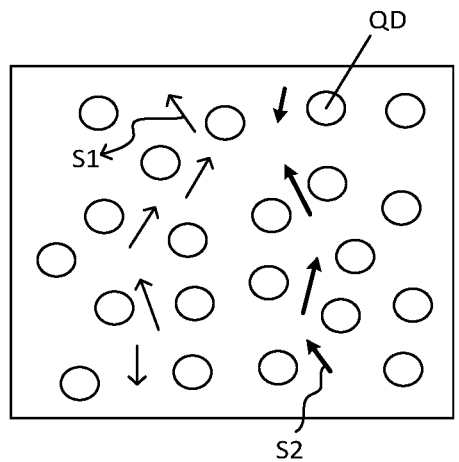
FIG. 11 is a schematic view showing hole and electron transport in a quantum dot film according to the related art.
Figure 12:
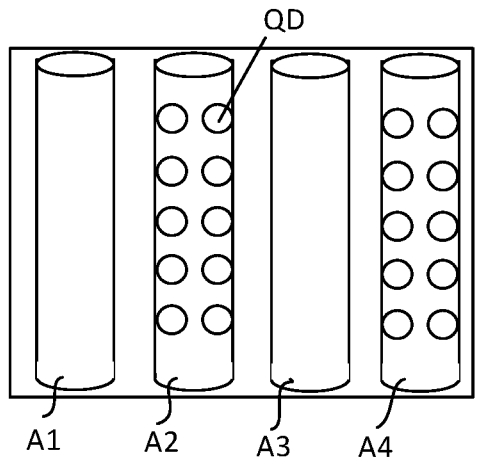
FIG. 12 is a schematic diagram of the polymer having the first segment and the second segment that are stacked to form respective transport channels in the quantum dot film provided in the present disclosure.
Figure 13:
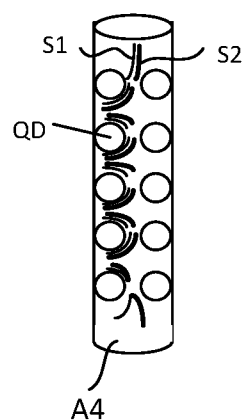
FIG. 13 is a schematic view showing hole and electron transport in the quantum dot film provided in the present disclosure.

Specifically, when the quantum dot film is applied to a quantum dot light emitting diode, the quantum dot film serves as a light emitting layer of the quantum dot light emitting diode. A hole transport layer and an electron transport layer are provided above and below the light emitting layer, respectively. Referring to FIG. 11, in the related art, the quantum dot film only comprises quantum dots (QD) without polymer molecular chain 1 of the present disclosure. In this case, the plurality of electrons S1 and the plurality of holes S2 in the quantum dot film have disordered and irregular transport paths, and it easily appears that electrons S1 and holes S2 pass through the quantum dot film without meeting and recombination with each other, forming an idle current, and thus the quantum dots (QD) are not activated, as shown in FIG. 11. In contrast, in the quantum dot film 100 provided in an example of the present disclosure, referring to FIG. 12, the first segment 11 comprises fused ring aromatic structure, the second segment 12 comprises polyamide linkage(s), and the body portion R1 of the quantum dot (QD) ligand comprises benzene ring structure or fused ring aromatic structure. Because of the π-π interaction between fused ring aromatic structures of different first segments 11 and the hydrogen-bond interaction between polyamide linkages of different second segments 12, these two different interactions (π-π interaction and hydrogen-bond interaction) promote spontaneous respective stacking of first segments 11 and second segments 12, respectively. The stacked first segments 11 form carrier transport channels (e.g., A2 and A4 in FIG. 12), and the stacked second segments 12 form additional transport channels (e.g., A1 and A3 in FIG. 12). Since none of the polyester, the polyether or the polyamide linkage in the second segment 12 contains an electron cloud, the carriers (electrons S1 and holes S2) cannot be transported, and therefore, the carriers are accumulated in the carrier transport channels formed of the first segments 11 to be transported, that is, to be transported in a jumping manner through the overlapped electron cloud in the first segments 11. Referring to FIG. 12, since the body portion R1 of the quantum dot (QD) ligand has a benzene ring structure or a fused ring aromatic structure, the benzene ring structure or the fused ring aromatic structure in the body portion R1 forms π-π interaction with the fused ring aromatic structure in the first segments 11, so that the quantum dots (QD) are anchored in the carrier transport channels formed of the first segments 11 (e.g., A2 and A4 in FIG. 12). Referring to FIG. 13, taking the carrier transport channel A4 formed of the first segments 11 as an example, carriers (electrons S1 and holes S2) are transported in a jumping manner in the carrier transport channel A4, and these carriers will certainly meet while passing through the quantum dots (QD) and be recombined on the quantum dots (QD), thereby preventing electrons S1 and holes S2 from passing through the quantum dot film without meeting, and improving the light emitting performance of the quantum dot light emitting diode.

Further, based on the case in which the quantum dot (QD) ligand comprises body portion R1 in the above example, the quantum dot (QD) ligand may further comprise a long-chain portion R2 and a short-chain portion R3. The body portion R1 is connected between the long-chain portion R2 and the short-chain portion R3, and the short-chain portion R3 is connected to the corresponding quantum dot (QD) (i.e., the quantum dot coordinated to the ligand). Therefore, the general formula of the ligand may be represented as R2-R1-R3, and the quantum dot (QD) is connected at R3. Alternatively, the long-chain portion R2 of the ligand is an alkane chain, which may increase the solubility of the quantum dot (QD). The short-chain portion R3 comprises a carbon chain, and a coordinating group at a terminal of the carbon chain. The coordinating group is connected to the quantum dot (QD), thereby connecting the ligand with the quantum dot (QD). The coordinating group may be, for example, amino, carboxyl, mercapto, and the like.

Alternatively, the long-chain portion R2 of the ligand has a number of carbon atoms not more than 8, and the short-chain portion R3 of the ligand has a number of carbon atoms not more than 4.

It should be noted that, the following five cases can be combined arbitrarily: the first segment 11 comprises at least one polar group; the first segment 11 comprises a fused ring aromatic structure; the second segment 12 comprises polyether; the second segment 12 comprises polyester; and the second segment 12 comprises polyamide linkage. For example, the first segment 11 of polymer 1 may comprise at least one polar group without the fused ring aromatic structure, and the second segment 12 may comprise polyether with no polyamide linkage; the first segment 11 may comprise a fused ring aromatic structure with no polar group, and the second segment 12 may comprise polyester and polyamide linkage; the first segment 11 may comprise a fused ring aromatic structure and polar groups, and the second segment 12 may comprise polyester and polyamide linkage; and the like, which are not limited herein.

Figure 14:
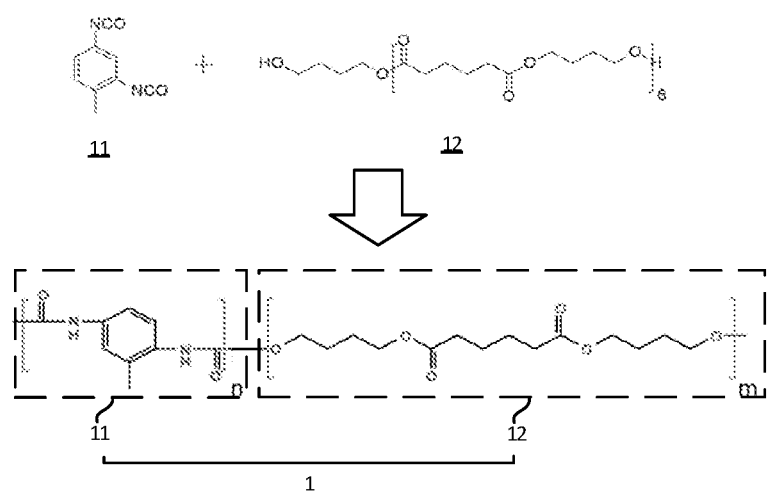
FIG. 14 is a schematic illustration of a polymerization reaction for forming an exemplary polymer in the quantum dot film provided in the present disclosure.

Alternatively, FIG. 14 shows an exemplary polymer 1 of the quantum dot film 100, in which the first segment 11 comprises at least one polar group, and the second segment 12 comprises polyester, wherein the first segment 11 is formed from toluene diisocyanate (as shown in FIG. 2), and the second segment 12 is formed of polybutylene glycol adipate (as shown in FIG. 6). As shown in FIG. 14, polymer 1 is formed by polymerization from toluene diisocyanate and polybutylene glycol adipate. Polymer 1 comprises the first segment 11 formed from n units of toluene diisocyanate, and the second segment 12 formed of m units of polybutylene glycol adipate, wherein n≥1, and m≥1.

Figure 15:
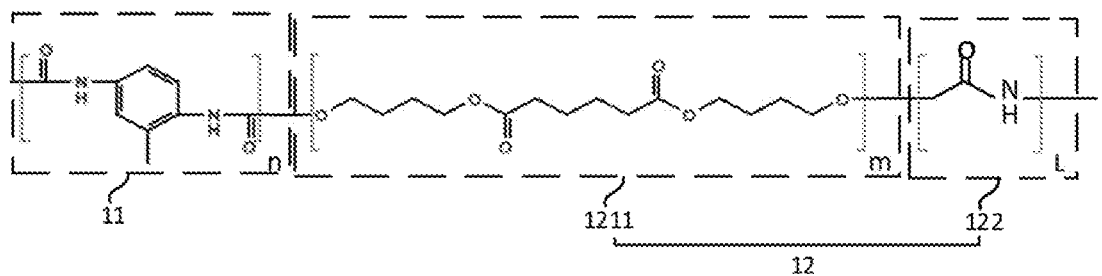
FIG. 15 is a molecular structure of an exemplary polymer (containing toluene diisocyanate structural units, polybutylene glycol adipate and polyamide linkage) in the quantum dot film provided in the present disclosure.

Further, as shown in FIG. 15, the second segment 12 of polymer 1 comprises units formed of polybutylene glycol adipate segment 1211 and polyamide linkage 122.

The second segment 12 is formed by connecting m units of polybutylene glycol adipate 1211 with L units of polyamide linkage 122. Polymer 1 comprises the first segment 11 formed from n units of toluene diisocyanate, and the second segment 12 comprising polybutylene glycol adipate unit 1211 and polyamide linkage unit 122, wherein n≥1, m≥1, and L≥1.

Figure 16:
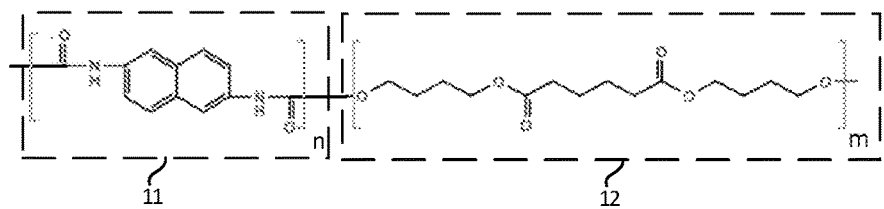
FIG. 16 is a molecular structure of an exemplary polymer (containing naphthalene diisocyanate structural units and polybutylene glycol adipate) in the quantum dot film provided in the present disclosure.

Further, FIG. 16 shows an exemplary polymer 1 of the quantum dot film 100, in which the first segment 11 comprises a fused ring aromatic structure, specifically naphthalene molecular structure, and the second segment 12 comprises polyester, wherein the first segment 11 is formed from naphthalene diisocyanate (as shown in FIG. 5), and the second segment 12 is formed of polybutylene glycol adipate (as shown in FIG. 6). Polymer 1 comprises the first segment 11 formed from n units of naphthalene diisocyanate, and the second segment 12 formed of m units of polybutylene glycol adipate, wherein n≥1, and m≥1.

Figure 17:
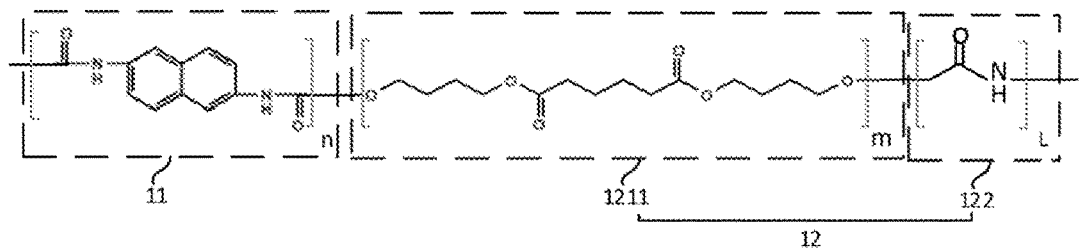
FIG. 17 is a molecular structure of an exemplary polymer (containing naphthalene diisocyanate structural units, polybutylene glycol adipate and polyamide linkage) in the quantum dot film provided in the present disclosure.

Further, as shown in FIG. 17, the second segment 12 of polymer 1 comprises polybutylene glycol adipate unit 1211 and polyamide linkage unit 122. The second segment 12 is formed by connecting m units of polybutylene glycol adipate 1211 with L units of polyamide linkage 122. The polymer 1 comprises the first segment 11 formed from n units of naphthalene diisocyanate, and the second segment 12 comprising polybutylene glycol adipate segment 1211 and polyamide linkage 122, wherein n≥1, m≥1, and L≥1.

Alternatively, the first segment 11 has a molecular weight of greater than or equal to 1000 and less than or equal to 10000, i.e., the molecular weight of the first segment 11 is in the range of 1000 to 10000. The second segment 12 has a molecular weight of greater than or equal to 1000 and less than or equal to 10000, i.e., the molecular weight of the second segment 12 is in the range of 1000 to 10000.

Alternatively, the first segment 11 may be present in polymer 1 in an amount of 10 mass % to 20 mass %, and correspondingly, the second segment 12 may be present in polymer 1 in an amount of 90 mass % to 80 mass %.

Figure 18:
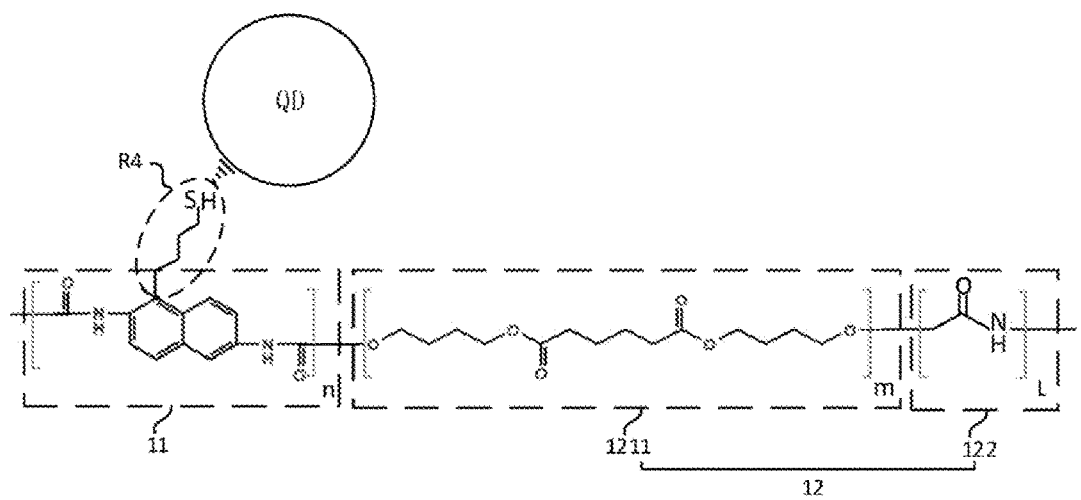
FIG. 18 is a schematic diagram of an example of the polymer as a ligand connected to the quantum dot in the quantum dot film provided in the present disclosure.

Alternatively, in the quantum dot film 100, the polymer molecular chain 1 may be doped with the quantum dots (QD) in various ways. For example, as shown in FIG. 1, a plurality of polymer molecular chains 1 may be blended with a plurality of quantum dots, that is, the plurality of polymer molecular chains 1 are distributed among the plurality of quantum dots (QD). Alternatively, as shown in FIG. 18, the polymer molecular chain 1 may be coordinated with the quantum dot (QD) as a ligand of the quantum dot (QD), and the quantum dots (QD) may be connected one by one to the polymer molecular chain 1. Specifically, taking the polymer 1 shown in FIG. 17 as an example, a coordinating chain R4 may be connected to the polymer molecular chain 1, and the polymer 1 may be coordinately connected to the quantum dot (QD) through the coordinating chain R4, wherein the coordinating chain R4 comprises a carbon chain, and a coordinating group at the terminal of the carbon chain. The coordinating chain R4 connects the polymer 1 to the quantum dot (QD) through the coordinating group. The coordinating group may include carboxyl, mercapto, amino, and the like. FIG. 18 illustrates an example in which the coordinating group is mercapto group SH.

A second aspect of the present disclosure provides a quantum dot device comprising the quantum dot film described above.

Figure 19:
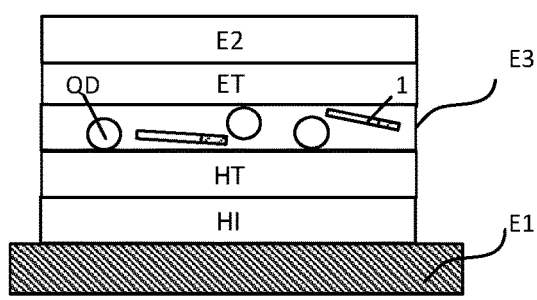
FIG. 19 is a schematic cross-sectional view of an exemplary quantum dot light emitting diode provided in the present disclosure.

As an example, the quantum dot device is a quantum dot light emitting diode. As shown in FIG. 19, the quantum dot light emitting diode (QLED) comprises a first electrode E1, a light emitting layer E3, and a second electrode E2. The light emitting layer E3 is arranged between the first electrode E1 and the second electrode E2. The light emitting layer E3 uses the quantum dot film 100 comprising a plurality of quantum dots (QD) and a plurality of polymer molecular chains 1. Polymer molecular chain 1 comprises at least one first segment 11 with high tensile modulus, and at least one second segment 12 with low flexural modulus. In addition, the QLED further comprises a hole injection layer HI arranged between the first electrode E1 and the light emitting layer E3 (i.e., the quantum dot film), a hole transport layer HT, and an electron transport layer ET arranged between the light emitting layer E3 and the second electrode E2. The QLED may emit different light under the activation of blue light according to the color of the quantum dots (QD) in the quantum dot film (i.e., the light emitting layer E3). For example, if the QLED is a red QLED, the quantum dot film serving as the light emitting layer E3 comprises red quantum dots and polymer molecular chains 1; if the QLED is a green QLED, the quantum dot film serving as the light emitting layer E3 comprises green quantum dots and polymer molecular chains 1; and if the QLED is a blue QLED, the quantum dot film serving as the light emitting layer E3 comprises blue quantum dots and polymer molecular chains 1, which are not limited herein. In the light emitting layer E3 of the QLED, the first segment 11 can provide hardness for the quantum dot film 100 due to the high tensile modulus of the first segment 11 of the polymer molecular chain 1, thereby preventing the quantum dot film 100 from being decomposed and expanded under the influence of illumination and electric current, and avoiding cracks of quantum dot film 100 during being bent and stretched; and the second segment 12 can be considered as providing softness for the quantum dot film 100 due to the low flexural modulus of the second segment 12 of the polymer molecular chain 1, thereby improving the bending performance of the quantum dot film 100. The polymer 1 produced by connecting the first segment 11 and the second segment 12 may improve the mechanical stability of the quantum dot film 100, and enable the deformation to recover while the quantum dot film 100 being easily bent, thereby avoiding cracks or unrecoverable deformation of the quantum dot film 100 after being bent for many times, and thus increasing service life of the quantum dot film.

As another example, the quantum dot device is a quantum dot color filter comprising a plurality of optical filter regions, each optical filter region is provided with an optical filter, and the optical filter comprises the quantum dot film.

Figure 20:
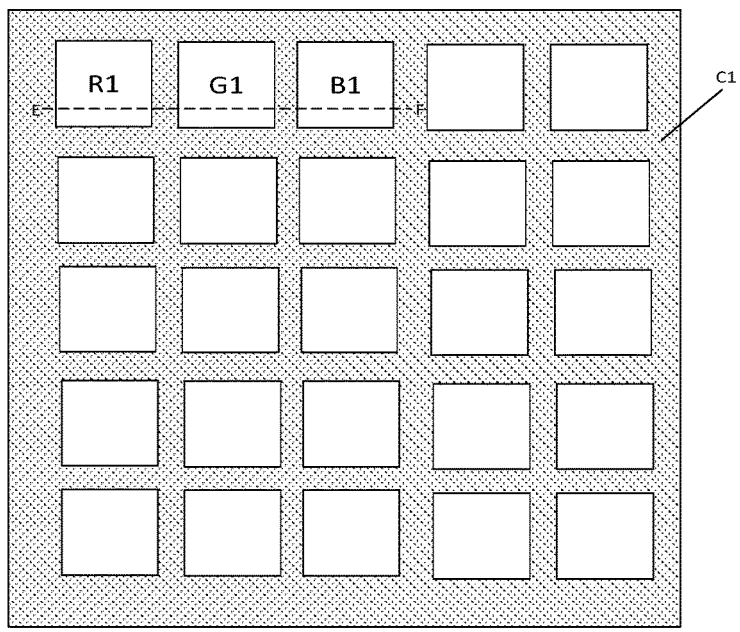
FIG. 20 is a schematic plan view of an exemplary quantum dot color filter provided in the present disclosure.
Figure 21:
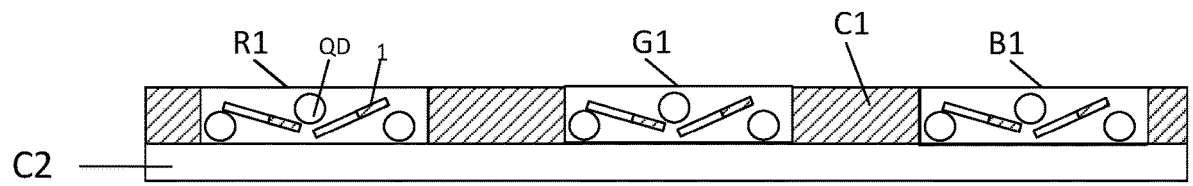
FIG. 21 is a schematic cross-sectional view of an exemplary quantum dot color filter provided in the present disclosure.

FIG. 20 shows a schematic plan view of an exemplary quantum dot color filter provided by the present disclosure, and FIG. 21 is a cross-sectional view taken along E-F in FIG. 20. As shown in the Figures, the present example provides a quantum dot color filter (QDCF) comprising a substrate C2 with a plurality of optical filter regions, each optical filter region is provided with an optical filter. The optical filter in the optical filter region uses quantum dot film 100 comprising a plurality of quantum dots (QD) and a plurality of polymer molecular chains 1. The polymer molecular chain 1 comprises at least one first segment 11 with high tensile modulus, and at least one second segment 12 with low flexural modulus.

Specifically, the optical filters may be optical filters of different colors, which are quantum dot film of different colors. The quantum dot films of different colors comprise quantum dots (QD) emitting light of different colors under excitation of blue light. The optical filter of one pixel unit may be formed by a plurality of optical filters arranged along the row direction. For example, referring to FIG. 21 that shows an exemplary pixel unit comprising a red subpixel, a green subpixel, and a blue subpixel arranged along a row direction, the red subpixel has a red optical filter R1 using the red quantum dot film, which comprises red quantum dots (QD) (i.e., quantum dots emitting red light under the excitation of blue light) and polymer molecular chains 1, and the region where the red quantum dot film is located is an optical filter region of the quantum dot color filter; the green subpixel has a green optical filter G1 using the green quantum dot film, which comprises green quantum dots (QD) (i.e., quantum dots emitting green light under the excitation of blue light) and polymer molecular chains 1, and the region where the green quantum dot film is located is an optical filter region of the quantum dot color filter; and the blue subpixel has a blue optical filter B1 using the blue quantum dot film, which comprises blue quantum dots (QD) (i.e., quantum dots emitting blue light under the excitation of blue light) and polymer molecular chains 1, and the region where the blue quantum dot film is located is an optical filter region of the quantum dot color filter. Light shielding structures C1 are provided between the optical filters of the respective colors to prevent crosstalk of light between adjacent optical filters. In the optical filters of QDCF (i.e., R1, G1 and B1 in FIG. 21), the first segment 11 can be considered as providing hardness for the quantum dot film 100 due to the high tensile modulus of the first segment 11 of the polymer molecular chain 1, thereby preventing the quantum dot film 100 from being decomposed and expanded under the influence of illumination and electric current, and avoiding cracks of quantum dot film 100 during being bent and stretched; and the second segment 12 can be considered as providing softness for the quantum dot film 100 due to the low flexural modulus of the second segment 12 of the polymer molecular chain 1, thereby improving the bending performance of the quantum dot film 100. The polymer 1 produced by connecting the first segment 11 and the second segment 12 may improve the mechanical stability of the quantum dot film 100, and enable the deformation to recover while the quantum dot film 100 being easily bent, thereby avoiding cracks or unrecoverable deformation of the quantum dot film 100 after being bent for many times, and thus increasing the service life of the quantum dot film.

Figure 22:
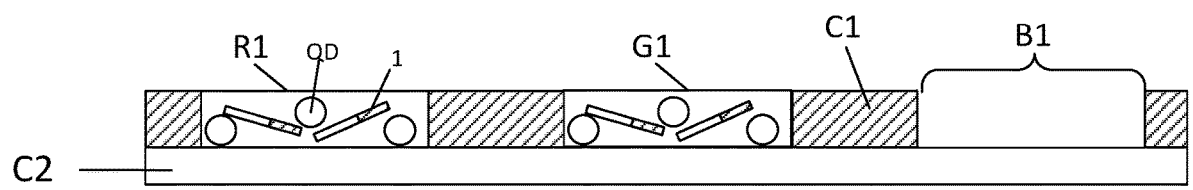
FIG. 22 is a schematic cross-sectional view of another exemplary quantum dot color filter provided in the present disclosure.

Alternatively, in some examples referring to FIG. 22, if the QDCF is applied to a display panel, the display panel further comprises a display substrate arranged below the QDCF, and the display substrate has a light emitting device for emitting blue light. Since the display substrate emits blue light, the blue quantum dot film may not be arranged at the optical filter region where the blue optical filter B1 of the blue subpixel is located, and a hollow structure can be used, so that blue light emitted by the light emitting device on the display substrate directly exits through the hollow structure to serve as the exiting light of the blue optical filter B1.

Figure 23:
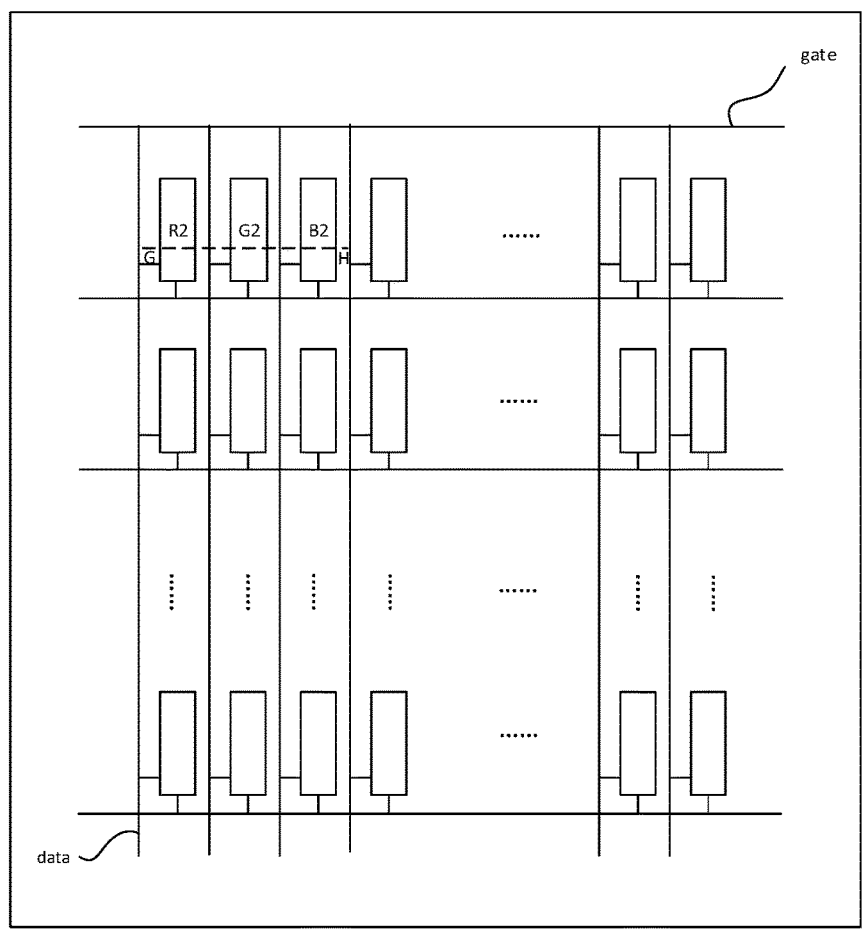
FIG. 23 is a schematic plan view of an exemplary QLED display panel provided in the present disclosure.
Figure 24:
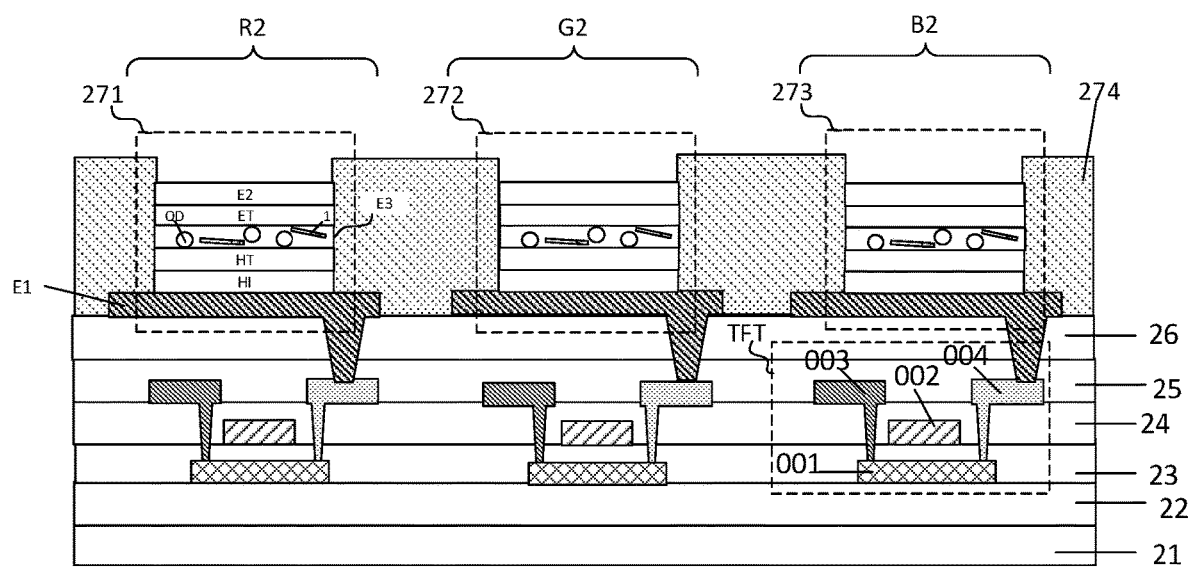
FIG. 24 is a schematic cross-sectional view of an exemplary QLED display panel provided in the present disclosure.

FIG. 23 is a schematic view of the layer structure of an exemplary QLED display panel provided by the present disclosure, and FIG. 24 is a cross-sectional view taken along G-H in FIG. 24. As shown in FIGS. 23 and 24, the display panel comprises a plurality of subpixels, such as the red subpixel R2, the green subpixel G2, and the blue subpixel B2 in FIG. 23. Each subpixel is provided with the above-described quantum dot light emitting diode. In this example, each subpixel (any one of the red subpixel R2, the green subpixel G2, and the blue subpixel B2) comprises a quantum dot light emitting diode corresponding to the color of the subpixel, and a thin film transistor (TFT) arranged on a side of the quantum dot light emitting diode away from the light exit side. The TFT is connected to the quantum dot light emitting diode such that the quantum dot light emitting diodes are driven to emit light. The display panel further comprises a plurality of gate lines extending in a row direction, and a plurality of data lines extending in a column direction. A gate line connects to the TFTs in a row of subpixels, and a data line connects to the TFTs in a column of subpixels.

Referring to FIG. 24, the following description will be made by taking the case in which every three adjacent subpixels in the row direction are red subpixel R2, green subpixel G2, and blue subpixel B2 as an example. The display panel comprises a substrate 21, and a buffer layer 22 is arranged on the substrate 21. The TFT film layers of each subpixel are arranged on a side of the buffer layer 22 away from the substrate 21. Taking the layer structure of one pixel unit (comprising red subpixel R2, green subpixel G2 and blue subpixel B2) as an example, the three TFTs corresponding to red subpixel R2, green subpixel G2 and blue subpixel B2 respectively are arranged on the side of the buffer layer 22 away from the substrate 21. Specifically, the TFT film layers comprises an active layer 001 arranged on a side of the buffer layer 22 away from the substrate 21, a gate 002 arranged on a side of the active layer 001 away from the substrate 21, a gate insulating layer 23 arranged between the gate 002 and the active layer 001, a source 003 and a drain 004 arranged in the same layer on a side of the gate 002 away from the substrate 21, and an interlayer insulating layer 24 arranged between the layer where the source 003 and the drain 004 are arranged and the gate 002. A protection layer (PVX) 25 is further arranged on a side of the TFT film layer away from the substrate 21, that is, the side of the layer comprising source 003 and drain 004 away from the substrate 21, so as to protect the TFT film layer structure. A planarization layer (PLN) 26 is arranged on a side of the protection layer 25 away from the substrate 21. The quantum dot light emitting diodes of each subpixel are arranged on a side of the planarization layer 26 away from the substrate 21. Taking a pixel unit as an example, the side of the planarization layer 26 away from the substrate 21 is provided with a red quantum dot light emitting diode 271 corresponding to the red subpixel R2, a green quantum dot light emitting diode 272 corresponding to the green subpixel G2 and a blue quantum dot light emitting diode 273 corresponding to the blue subpixel B2. A pixel defining layer (PDL) 274 is arranged among the quantum dot light emitting diodes (271, 272 and 273). The green quantum dot light emitting diode 272, the blue quantum dot light emitting diode 273, and the red quantum dot light emitting diode 271 have the same layer structure except that the light emitting layers E3 (i.e., quantum dot films) are quantum dot films corresponding to different colors. In this case, quantum dot films of each quantum dot emitting diode (271, 272 and 273) comprise a plurality of quantum dots (QD) corresponding to the light exiting color of the quantum dot emitting diode, and a plurality of polymer molecular chains. The polymer molecular chain 1 comprises at least one first segment 11 with high tensile modulus and at least one second segment 12 with low flexural modulus. The polymer 1, formed by connecting the first segment 11 to the second segment 12, may improve the mechanical stability of the quantum dot film 100, and enable the deformation to recover while the quantum dot film 100 being easily bent, thereby avoiding cracks or unrecoverable deformation of the quantum dot film 100 after being bent for many times, and thus increasing the service life of the quantum dot film.

Figure 25:
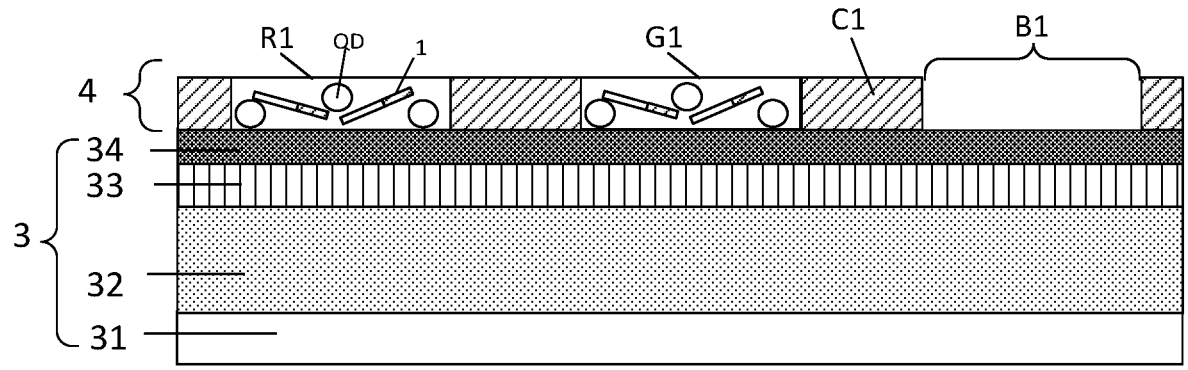
FIG. 25 is a schematic cross-sectional view of another exemplary QLED display panel provided in the present disclosure.

FIG. 25 shows an exemplar display panel comprising the quantum dot color filter 4 and the display substrate 3 oppositely arranged, which are paired to form the display panel. The specific structure of the quantum dot color filter 4 is shown in FIGS. 20 to 22, and the following description will be made by taking the quantum dot color filter 4 shown in FIG. 22 as an example. In this case, the quantum dot color film 4 comprises a plurality of optical filter regions, each filter region is provided with an optical filter, such as red optical filter R1, green optical filter G1, and blue optical filter B1 in the Figure. The optical filters in the optical filter regions use the quantum dot film 100 comprising a plurality of quantum dots (QD) and a plurality of polymer molecular chains 1. The polymer molecular chain 1 comprises at least one first segment 11 with high tensile modulus, and at least one second segment 12 with low flexural modulus. The display panel 3 comprises a substrate 31 and a plurality of light emitting devices 33 on the substrate 31, wherein the plurality of light emitting devices 33 emit blue light. The blue light irradiates each optical filter in the quantum dot color filter 4, and quantum dots in each optical filter are activated to emit light of a color corresponding to the optical filter.

Alternatively, the display panel 3 further comprises a pixel circuit array 32 arranged between the substrate 31 and the plurality of light emitting devices 33 for driving the plurality of light emitting devices 33 to emit light.

Further, the display panel 3 further comprises an encapsulation layer 34 for encapsulating the light emitting device 33, and isolating the light emitting device 33 from moisture and oxygen. The light emitting device 33 may include various types of light emitting devices such as an organic light emitting diode (OLED), a mini light emitting diode (Mini LED), and the like.

The above-described substrates of the display panels may be flexible substrates, such as polyimide substrate, so that the display panel may be a flexible panel, which is not limited herein.

The embodiment of the present disclosure also provides a display device comprising the above-described display panel. It should be noted that, the display device provided in this embodiment may be any product or component with a display function, such as a mobile phone, a tablet computer, a television, a display, a notebook computer, a digital photo frame, a navigator and the like. Other essential components of the display device are understood by a skilled person in the art, and are not described herein nor should they be construed as limiting the present disclosure.

Figure 26:
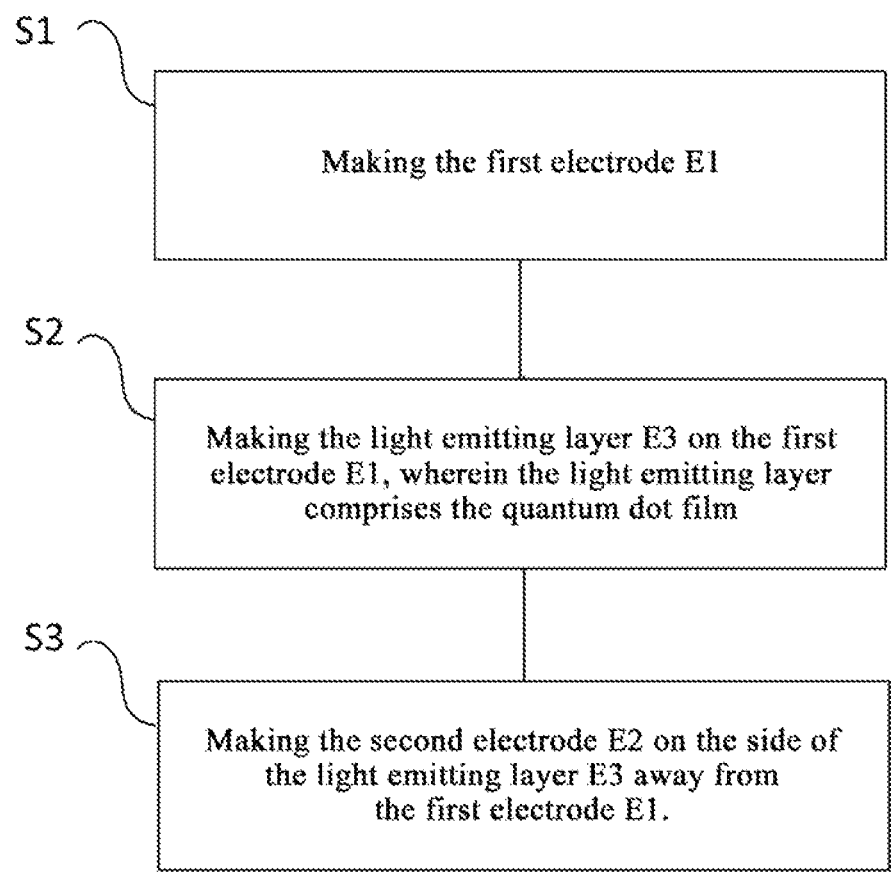
FIG. 26 is a flow chart of an exemplary method for manufacturing the quantum dot light emitting diode provided in the present disclosure.

As an example, the present disclosure further provides a method for manufacturing the quantum dot light emitting diode. As shown in FIG. 26, the manufacturing method comprises the following steps:

S1, making a first electrode E1.

Specifically, taking the QLED shown in FIG. 19 as an example, the first electrode E1 is made on the substrate by evaporating the material of the first electrode E1 on the substrate, and then etching to form the first electrode E1 corresponding to each quantum dot light emitting diode.

S2, making the light emitting layer E3 on the first electrode E1, wherein the light emitting layer includes the above quantum dot film.

S3, making the second electrode E2 on the side of the light emitting layer E3 away from the first electrode E1.

Specifically, the second electrode E2 is formed by evaporating the material of the second electrode E2 on a side of the light emitting layer E3 (specifically, the electron transport layer) away from the first electrode E1, and then etching to form the second electrode E2 corresponding to each quantum dot light emitting diode.

Figure 27:
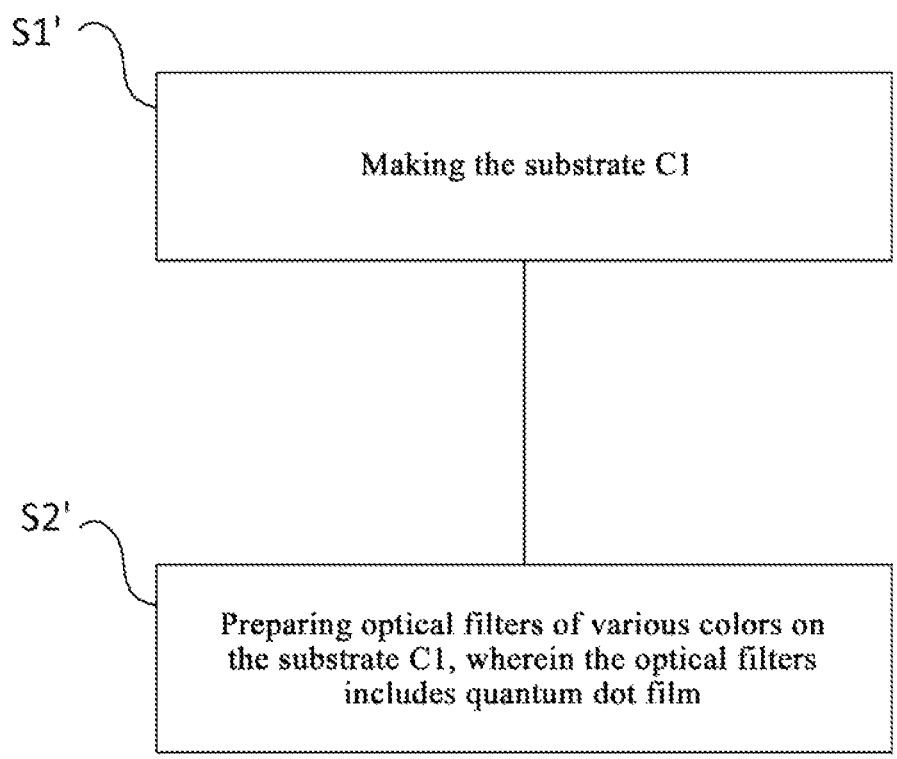
FIG. 27 is a flow chart of an exemplary method for manufacturing the quantum dot color filter provided in the present disclosure

As an example, the present disclosure further provides a method for manufacturing the quantum dot color filter. As shown in FIG. 27, the manufacturing method comprises the following steps:

S1', making the substrate C1.

Alternatively, the substrate C1 may be a transparent substrate, such as polyimide substrate. If the color filter substrate is applied to a display panel, the substrate C1 can refer to a film layer of the display substrate contacting with the color filter, such as an encapsulation layer of the display substrate.

S2', making optical filters of various colors on the substrate C1, wherein the optical filters include the above quantum dot films.

EXAMPLE 1

In this example, the first segment 11 of polymer 1 was formed from naphthalene diisocyanate, and the second segment 12 was formed of polybutylene glycol adipate, wherein the content of naphthalene diisocyanate monomer unit was 15 mass %, and the content of polybutylene glycol adipate was 85 mass %. Polymer 1 was coordinated to the quantum dots (QD) using a mercapto coordinating chain. Firstly, quantum dots (QD) (CdSe/ZnS quantum dots with oleic acid ligand) and the polymer 1 were mixed (quantum dot:polymer (mass ratio)=1:20), and stirred at room temperature for 10 hours to perform heterogeneous ligand exchange. After the ligand exchange was completed, the mixture was dissolved in isopropanol to form a polymer 1 solution with a concentration of 15 mg/ml, which was a material for forming a quantum dot film, for use. Then, a material (poly(3, 4-ethylenedioxythiophene), PEDOT) of the hole injection layer was spin-coated on the film layer where the first electrode E1 (ITO, indium tin oxide) was located, with a spin-coating speed of 2000 rpm and a spin-coating time of 45 s. Then, the hole injection layer was formed by annealing process at the temperature of 200° C. Then, a material (poly(9,9-dioctyl fluorene-co-N-(4-(3-methylpropyl))-diphenylamine), TFB) of the hole transport layer was spin-coated on the hole injection layer, with a spin-coating speed of 3000 rpm and a spin-coating time of 45 s. The hole transport layer was formed by annealing process at the temperature of 135° C. Next, the quantum dot film solution was spin-coated on the hole transport layer. After the spin-coating was completed, the quantum dot film (i.e., the light emitting layer E3) was formed by performing annealing process for 20 minutes at the temperature of 120° C. Then, the zinc oxide nanoparticle solution with a concentration of 30 mg/ml was spin-coated on the quantum dot film with a spin-coating speed of 1500 rpm, wherein the zinc oxide nanoparticles have a ligand of ethanolamine. The electron transport layer was then formed by performing annealing process for 20 minutes at the temperature of 120° C.

The second electrode E2 was formed by evaporating the material (silver) of the second electrode E2 on the side of the light emitting layer E3 away from the first electrode E1, and then etching to form the second electrode E2 corresponding to each quantum dot light emitting diode.

The quantum dots (QD) may be, for example, alloy quantum dots with oleic acid ligand, such as cadmium selenium/zinc sulfide (CdSe/ZnS) quantum dots. Corresponding to quantum dot light emitting diodes of different colors, the CdSe/ZnS quantum dots may be red, green and blue CdSe/ZnS quantum dots. It should be noted that the quantum dots used in the quantum dot films of QLEDs with different colors emit light with different colors after being excited.

EXAMPLE 2

In this example, the first segment 11 of polymer 1 was formed from toluene diisocyanate, and the second segment 12 was formed of polybutylene glycol adipate, wherein the content of toluene diisocyanate monomer units was 15 mass %, and the content of polybutylene glycol adipate monomer units was 85 mass %.

The quantum dots (QD) were alcohol-soluble CdSe/ZnS quantum dots of silicon dioxide. Corresponding to optical filters with different colors, the CdSe/ZnS quantum dots may be red, green and blue CdSe/ZnS quantum dots. Since the blue subpixel portion can be directly hollowed out, the blue CdSe/ZnS quantum dots may be omitted. First, CdSe/ZnS quantum dots and a positive photoresist were mixed wherein the positive photoresist is propylene glycol methyl ether acetate (PGMEA) solution, and stirred at room temperature for 10 hours to uniformly disperse the CdSe/ZnS quantum dots in the positive photoresist. Then, the polymer 1 was added in an amount of 10 times (mass) of the quantum dot. The mixture was uniformly stirred, and was used as the material for forming the quantum dot film. In the mixture, the polymer 1 accounted for about 15 volume %, CdSe/ZnS quantum dots accounted for about 10 volume %, and the positive photoresist accounted for 75 volume %. The mixture (i.e., the material of the quantum dot film) was spin-coated on the substrate C1 (an ITO substrate) with a spin-coating speed of 4000 rpm and a spin-coating time of 45 s. Then, the material of the quantum dot film was pre-baked and post-baked. The first baking was performed at 90° C. for 90 s. After exposure at an amount of 60 mj/cm$^2$, the material of the quantum dot film was developed using tetramethyl-ammonium hydroxide (TMAH) with a concentration of 2.45% for 90 s. After the development is completed, the second baking was performed at 120° C. for 120 s, and the patterned quantum dot film was obtained, namely the optical filter was formed. And then, light shielding structures C1 were arranged between the filters with different colors.

When the color filter is applied to a display substrate, with reference to FIG. 25, the optical filter (i.e., the quantum dot film) is arranged on the encapsulation layer 34 of the display substrate 3. The encapsulation layer 34 may be treated with hexamethyldisilazane (HMDS) which may increase adhesion between the film layers, so that the quantum dot film can be tightly attached to the encapsulation layer 34.

It can be understood that the foregoing embodiments are merely illustrative embodiments employed for describing the principle of the present disclosure. However, the present disclosure is not limited thereto. For a skilled person in the art, various variations and modifications can be made without departing from the spirit and essence of the present disclosure. These variations and modifications are regarded as the protection scope of the present disclosure.

The invention claimed is:
1. A quantum dot film comprising a plurality of quantum dots and a plurality of polymer molecular chains,
wherein the polymer molecule chain comprises a first segment and a second segment; and
wherein the first segment has a tensile modulus greater than that of the second segment, and the second segment has a flexural modulus less than that of the first segment,
wherein the first segment comprises at least one polar group and fused aromatic ring structure, a structure of the first segment comprises the fused aromatic ring structure, and at least one branched chain connected to the fused aromatic ring structure, wherein the branched chain connected to the fused aromatic ring structure comprises the at least one polar group, wherein the fused aromatic ring structures on different first segments of the polymer molecule chain attract with each other to form π-π interaction in the quantum dot film, leading to formation of carrier transport channels assembled by stacking of the first segments, the second segment comprises polyester or polyether; the second segment further comprises a polyamide linkage, wherein each of the quantum dots is linked with a ligand, the ligand is represented by a formula R2-R1-R3, wherein R2 is an alkane chain, R3 comprises a carbon chain and a coordinating group at a terminal of the carbon chain, the coordinating group is connected to the quantum dot, R1 is a body portion connected between R2 and R3, the body portion comprises a benzene ring structure or a fused aromatic ring structure.

2. The quantum dot film according to claim 1, wherein the first segment has a tensile modulus greater than 10 Gpa, and the second segment has a tensile modulus greater than 5 Gpa; and the first segment has a flexural modulus less than 4 GPa, and the second segment has a flexural modulus less than 2 GPa.

3. The quantum dot film according to claim 1, wherein the polar group is at least one selected from alkyl, carboxyl, aldehyde group, carbonyl, amine group, epoxy group, hydroxyl, alkenyl, and alkynyl; and the fused aromatic ring structure are substituted or unsubstituted, and in the case of substitution, at least one hydrogen in the aromatic ring is substituted by at least one selected from the group consisting of alkyl, alkylthio, halogen atom, hydroxyl, amino, alkenyl, alkynyl, aryl, ester group, mercapto, cyano, and nitryl group.

4. The quantum dot film according to claim 3, wherein the fused aromatic ring structure are at least one selected from naphthyl, acenaphthylene, acenaphthenyl, fluorenyl, phenanthryl, anthryl, fluoranthryl, pyrenyl, benzo(a)anthryl, benzo(a)pyrenyl, indene(1, 2, 3-cd)pyrenyl, and dibenzo(a, n)yl.

5. The quantum dot film according to claim 1, wherein the polyester is derived from at least one of polybutylene glycol adipate and polycaprolactone diol; and the polyether is at least one of polytetramethylene ether glycol and polyethylene glycol.

6. The quantum dot film according to claim 1, wherein the first segment is formed from polymerization of at least one of toluene diisocyanate and naphthalene diisocyanate, and the second segment is derived from at least one of polybutylene glycol adipate, polytetramethylene ether glycol, and polyethylene glycol.

7. The quantum dot film according to claim 1, wherein the plurality of polymer molecular chains are distributed among the plurality of quantum dots;

and, the polymer molecular chain is a ligand of the quantum dot, with coordinating chains connected to the polymer, and the quantum dot is connected one by one to the polymer molecular chains through the coordinating chains.

8. A quantum dot device comprising the quantum dot film of claim 1.

9. The quantum dot device according to claim 8, wherein the quantum dot device is a quantum dot light emitting diode comprising, in sequence, a first electrode, a light emitting layer, and a second electrode, the light emitting layer being arranged between the first electrode and the second electrode; wherein the light emitting layer comprises the quantum dot film.

10. The quantum dot device according to claim 9, wherein the quantum dot light emitting diode further comprises a hole injection layer and a hole transport layer in sequence on the first electrode, and an electron transport layer between the light emitting layer and the second electrode, wherein the light emitting layer is arranged on the hole transport layer.

11. The quantum dot device according to claim 8, wherein the quantum dot device is a quantum dot color filter substrate comprising a plurality of optical filter regions, each optical filter region is provided with an optical filter, and the optical filter comprises the quantum dot film.

12. The quantum dot device according to claim 11, wherein the optical filter comprises a red optical filter, a green optical filter and a blue optical filter, the quantum dot color filter substrate further comprises a substrate and a light shielding structure arranged between the optical filters of each of colors, and the optical filters and the light shielding structure are both arranged on the substrate.

13. A display panel comprising the quantum dot device of claim 8.

14. The display panel according to claim 13, wherein the quantum dot device is a quantum dot light emitting diode, the display panel further comprises red, green, and blue subpixels, and each of the red, green, and blue subpixels comprises a quantum dot light emitting diode corresponding to the color of the subpixel, and a thin film transistor (TFT) arranged on a side of the quantum dot light emitting diode away from the light exit side, the TFT is connected to the quantum dot light emitting diode such that the quantum dot light emitting diode is driven to emit light.

15. The display panel according to claim 13, wherein the quantum dot device is a quantum dot color filter substrate, wherein the display panel comprises the quantum dot color filter substrate and a display substrate, and the display substrate and the quantum dot color filter are arranged opposite to each other.

\* \* \* \* \*